United States Patent
Beppu et al.

[11] Patent Number: 5,866,471
[45] Date of Patent: Feb. 2, 1999

[54] METHOD OF FORMING SEMICONDUCTOR THIN FILM AND METHOD OF FABRICATING SOLAR CELL

[75] Inventors: Tatsuro Beppu, Tokyo; Shuji Hayase, Yokohama; Atsushi Kamata, Fujisawa; Kenji Sano, Tokyo; Toshiro Hiraoka, Yokohama, all of Japan

[73] Assignee: Kabushiki Kaisha Toshiba, Kawasaki, Japan

[21] Appl. No.: 773,127

[22] Filed: Dec. 26, 1996

[30] Foreign Application Priority Data

| Dec. 26, 1995 | [JP] | Japan | 7-338877 |
| Dec. 26, 1995 | [JP] | Japan | 7-338878 |
| Dec. 26, 1995 | [JP] | Japan | 7-338940 |
| Sep. 19, 1996 | [JP] | Japan | 8-247869 |

[51] Int. Cl.$^6$ .................................................. H01L 31/18
[52] U.S. Cl. ............................ 438/502; 438/63; 438/82; 438/488; 136/258; 136/261
[58] Field of Search ............................. 438/502, 63, 82, 438/488; 136/258, 261

[56] References Cited

FOREIGN PATENT DOCUMENTS 2-251135  10/1990  Japan .

Primary Examiner—Mark Chapman
Attorney, Agent, or Firm—Oblon, Spivak, McClelland, Maier & Neustadt, P.C.

[57] ABSTRACT

A silicon thin film is formed by coating on a substrate a solution of polysilane represented by the general formula —$(SiR^1{}_2)_n$—, where $R^1$ substituents are selected from the group consisting of hydrogen, an alkyl group having two or more carbon atoms and a β-hydrogen, a phenyl group and a silyl group, and thermally decomposing the polysilane to deposit silicon.

21 Claims, 4 Drawing Sheets

METHOD OF FORMING SEMICONDUCTOR THIN FILM AND METHOD OF FABRICATING SOLAR CELL

BACKGROUND OF THE INVENTION

The present invention relates to a novel method of forming a semiconductor thin film and a method of fabricating a solar cell using the above method.

Conventional techniques to form a semiconductor thin film consisting of group IV element, i.e., silicon or germanium include vapor phase growing processes such as evaporation, sputtering, ion plating and CVD. These techniques however essentially require an use of a highly sealed reactor because they use a reduced pressure or hydrogen atmosphere upon film formation. Therefore, it is difficult to form a uniform semiconductor thin film on a large area substrate. This limits fabrication of products including a semiconductor thin film such as a solar cell, for example, having a larger area of an order of magnitude compared with any conventional product.

One technique to form a large area semiconductor thin film includes a use of liquid coating method. Japanese Laid-Open Patent Application Publication No. 4-119996 discloses a method of forming a silicon thin film by coating a silicon source compound such as octasilacubane on a substrate and thermally decomposing the silicon source compound. The method does not require any large-scaled expensive fabrication equipment such as a vacuum chamber and is advantageous in view of easily forming a silicon thin film on a large area substrate. However, such a compound as octasilacubane is disadvantageous in that it is unstable to oxygen and is easily oxidized and deteriorated in the air. Also such a compound have poor solubility into a solvent and is difficult to form a uniform thin film.

Likewise, conventional methods to form a compound semiconductor thin film include processes such as evaporation, sputtering, MOCVD and molecular beam epitaxy. These methods require a highly airtight reactor in a film formation process in order to prevent oxygen in the atmosphere from mixing into the reactor, so that they are inadequate to form a uniform compound semiconductor thin film on a large area substrate. In MOCVD (Metal Organic Chemical Vapor Deposition), for example, source materials of compound semiconductor constituents are fed to the reactor as gases, to form a compound semiconductor thin film by a solid deposition reaction from gas phase. Accordingly, the area of a substrate on which deposition is performed is limited by the size of the reactior.

In order to improve the problems, there is provided a technique in Japanese Laid-Open Patent Application Publication No. 5-503319 in which a precursor consisting of complex compound containing III group and V group elements is used to deposit a III-V group compound semiconductor on a substrate. However, there are only a few molecular species matching desired conditions of deposition reaction and that a ratio between a III group element and a V group element can not be arbitralily controlled. The method is therefore not used practically.

Further, when a solar cell is fabricated using a silicon thin film, it is necessary to form a silicon thin film doped with p- or n-type impurity. In the prior art, however, a silicon thin film is formed by thermal decomposition, and then impurities are doped by thermal diffusion or ion implantation so that a large-scaled apparatus is required to cause complication of fabrication processes.

BRIEF SUMMARY OF THE INVENTION

It is therefore an object of the present invention to provide a method of easily forming a large area semiconductor thin film consisting of silicon, germanium or a compound semiconductor, and a method of fabricating a large area solar cell using the above method.

According to the present invention, there is provided a method of forming a semiconductor thin film comprising steps of: coating a solution of semiconductor source material on a substrate; and thermally decomposing the source material to liberate semiconductor, wherein the semiconductor source material is selected from the group consisting of compounds represented by the general formulae (I) and (II), compounds represented by the general formulae (III) and (VI), compounds represented by the general formula (V) and compounds represented by the general formula (VI),

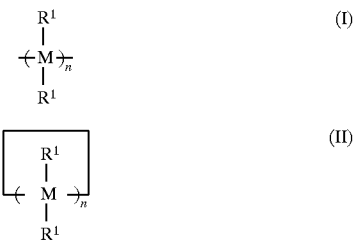

where M is selected from the group consisting of silicon and germanium, and individual $R^1$ substituents are independently selected from the group consisting of hydrogen, an alkyl group having of 2 or more carbon atoms and β-hydrogen, a phenyl group, and a silyl group,

where M is selected from the group consisting of silicon and germanium, X is a halogen atom, n is an integer of 4 or more, and a is 1 or 2,

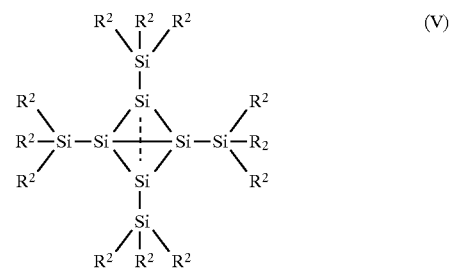

where individual $R^2$ substituents are independently selected from the group consisting of a substituted or unsubstituted alkyl group represented by the following formula, an aryl group, and an aralkyl group,

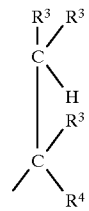

where individual $R^3$ substituents are independently selected from the group consisting of a hydrogen atom, a substituted or unsubstituted alkyl group having 1 to 15 carbon atoms, a substituted or unsubstituted aryl group having 6 to 15 carbon atoms, and a substituted or unsubstituted aralkyl group having 7 to 15 carbon atoms, and $R^4$ substituent is selected from the group consisting of a substituted or unsubstituted alkyl group having 1 to 15 carbon atoms, a substituted or unsubstituted aryl group having 6 to 15 carbon atoms, and a substituted or unsubstituted aralkyl group having 7 to 15 carbon atoms, and

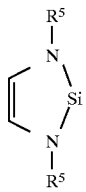

(VI)

where individual $R^5$ substituents are independently selected from the group consisting of a substituted or unsubstituted alkyl group having 1 to 15 carbon atoms, an aryl group, an aralkyl group, and a substituted or unsubstituted silyl group having 1 to 5 silicon atoms.

Other method of forming a semiconductor thin film according to the present invention comprises the steps of: coating a solution of a semiconductor source material selected from the group consisting of compounds represented by the general formulae (I) to (VI) mixed with a dopant source material providing p- or n-type conductivity on a substrate; and thermally decomposing the source materials to liberate semiconductor containing an impurity of a desired conductivity type.

Another method of forming a semiconductor thin film according to the present invention comprises the step of: coating a solution of a semiconductor source material selected from the group consisting of compounds represented by the general formulae (I) to (VI) on a substrate; and thermally decomposing the source material in an atmosphere containing a dopant source material providing p- or n-type conductivity to liberate semiconductor containing an impurity of a desired conductivity type.

According to the present invention, there is provided a method of fabricating a solar cell having a structure in which two or more semiconductor thin films having any of i-, p- and n- conductivity type are provided between a pair of electrodes so as to form a semiconductor junction, comprising steps of repeating two or more processes of forming semiconductor thin films having different conductivity type, wherein the process of forming an i-type semiconductor thin film comprising steps of:
coating a solution of a semiconductor source material selected from the group consisting of compounds represented by the general formulae (I) to (VI); and thermal decomposing the source material to liberate semiconductor, and wherein the process of forming a p- or n-type semiconductor thin film comprising steps of:
coating a solution of a semiconductor source material selected from the group consisting of compounds represented by the general formulae (I) to (VI) mixed with a dopant source material providing p- or n-type conductivity on a substrate; and thermally decomposing the source materials to liberate semiconductor containing an impurity of a desired conductivity type, or
coating a solution of a semiconductor source material selected from the group consisting of compounds represented by the general formulae (I) to (VI) on a substrate; and thermally decomposing the source material in an atmosphere containing a dopant source material providing p- or n-type conductivity to liberate semiconductor containing an impurity of a desired conductivity type.

A method of forming a compound semiconductor thin film according to the present invention comprises the steps of: coating a solution of an organometallic compound dissolved in an organic solvent on a substrate; and thermally decomposing the organometallic compound in a reducing atmosphere containing a hydride of a nonmetal element or derivative thereof to liberate metal from the organometallic compound and react the metal with the hydride of the nonmetal element or derivative thereof to form a compound semiconductor thin film.

According to the present invention, there is provided a method of fabricating a solar cell having a structure in which two or more compound semiconductor thin films having any of i-, p- and n- conductivity type are provided between a pair of electrodes so as to form a semiconductor junction, comprising steps of repeating two or more processes of forming compound semiconductor thin films while altering the species of organometallic compound or hydride of nonmetal element or derivative thereof, wherein the process of forming the compound semiconductor thin film comprising steps of:
coating a solution of an organometallic compound dissolved in an organic solvent on a substrate; and
thermally decomposing the organometallic compound in a reducing atmosphere containing a hydride of a nonmetal element or derivative thereof to liberate metal from the organometallic compound and react the metal with the hydride of the nonmetal element or derivative thereof to form a compound semiconductor thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
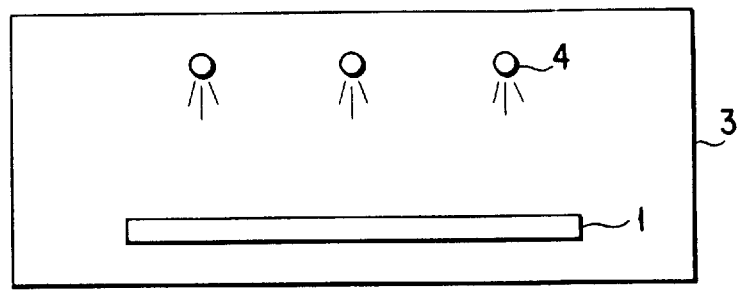
FIGS. 1A and 1B are schematic views illustrating apparatuses for performing the method of the present invention.

The present invention will be described in further detail.

In the present invention, as a substrate material, an arbitrary material selected from semiconductors such as silicon, glass, glass having a transparent electrode, metals, ceramics, and heat resistant polymers may be used.

There will be described a method of forming a semiconductor thin film consisting of silicon or germanium according to the present invention.

A compound represented by the general formula (I) or (II) is a silane or germanium compound having a one-dimensional chain (linear) or a cyclic structure. These compounds may be a copolymer or a mixture. In the present invention, there is used a compound that is solid at room temperature and is soluble in an organic solvent. In order to satisfy such conditions, a polymer having a linear structure, for example, should preferably have degree of polymerization n of 3 to 10000, and more preferably 5 to 30.

Examples of the compounds represented by the general formulae (I) and (II) are as follows. Although only linear polysilanes are described below, it is a matter of course that the compound may be a cyclic polysilane, or polygermane where silicon is replaced by germanium.

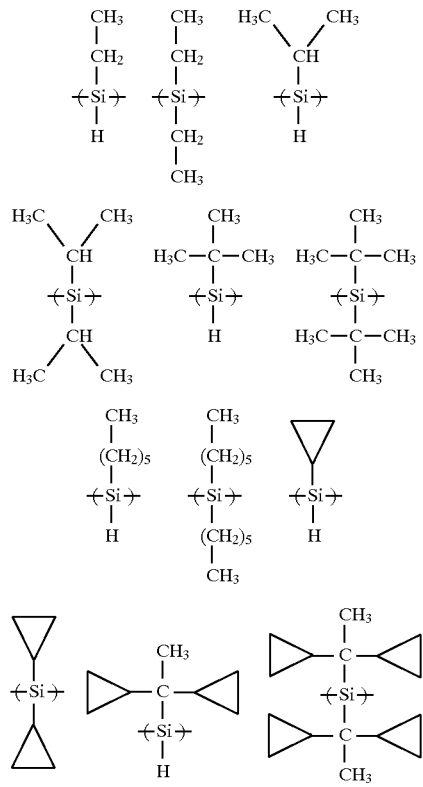

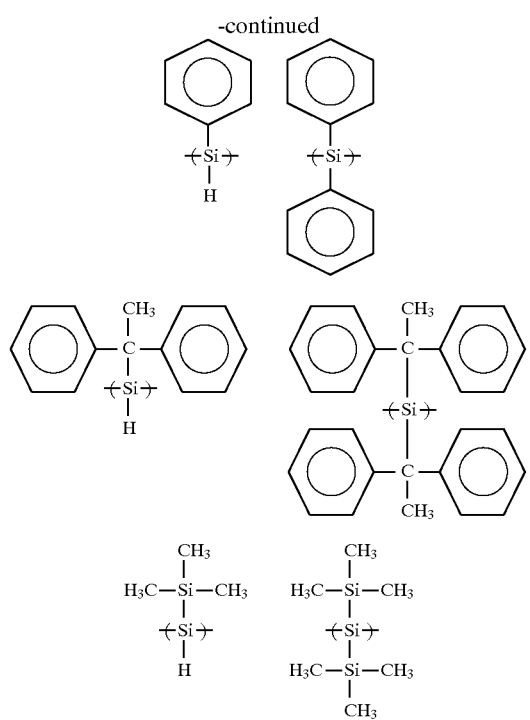

The compound represented by the general formula (III) or (IV) is a halide of silicon and/or germanium. In order to satisfy the condition that the halide is soluble in an organic solvent, the halide should preferably have weight-averaged molecular weight of 500 to 100,000. If the molecular weight is too low, the halide tends to be vaporized from the substrate prior to thermal decomposition, thus a film having a high quality is not obtained. When the molecular weight falls within the above range, vapor pressure of the halide at decomposition temperature is relatively low and the vaporization thereof from the substrate is negligible. If the molecular weight is too high, the solubility of the halide in a solvent is lowered, and therefore it is difficult to apply the halide onto a substrate.

The silane compound represented by the general formula (V) is solid at room temperature and soluble in an organic solvent, and also has a higher stability to oxidization.

The silylene compound represented by the general formula (VI) is solid at room temperature and soluble in an organic solvent, and also has a high stability to oxidization.

Compounds represented by the general formulae (I) to (VI) used in the present invention are soluble in an organic solvent so that they can be coated on a large area flat surface or curved surface by using any coating method such as dipping, spin coating, and spray coating, thereby forming a uniform coating film. Thickness of the coating film is preferably several tens $\mu$m. The apparatus used in the coating process may be arbitrarily selected in accordance with the size of the substrate. The coating apparatus is required merely to prevent the atmosphere from being mixed thereinto, and hence it is not necessary to use such a highly sealed and large-scaled vacuum apparatus as in the case with a vapor phase deposition.

In the present invention, the compound in the form of a film coated on a substrate is heated up to about its melting point in a desired atmosphere, e.g., in an inactive gas or in the reducing gas of hydrogen to evaporate a solvent and is thermally decomposed, thereby depositing silicon and/or germanium to form a semiconductor thin film. Pressure used in this reaction may be about atmospheric pressure (1 atm). Reaction products are preferably exhausted to be removed. Heating means is not limited specifically, for which a general electric furnace may be used or infrared rays may be irradiated as in a rapid thermal annealing or laser annealing may be used. Specific temperature for thermal decomposition depends on compounds used. In the case of compounds represented by the general formulae (I) and (II), for example, thermal decomposition is preferably performed in the range of 200° to 700° C. and more preferably in the range of 300° to 650° C. In the case of compounds represented by the general formulae (III) and (IV), although they are thermally decomposed in the range of about 250° C. to 1300° C., it is preferable to perform the reaction in the range of 300° to 500° C. In the case of compounds represented by the general formulae (V) and (VI), thermal decomposition is preferable performed in the range of 300° to 700° C. The rate of temperature rising may be set to about 5° C./min. Reaction time is set to 10 minutes to 10 hours. If desired, the thermal decomposition may be performed at a constant temperature without raising the temperature.

In the thermal decomposition reaction, there occurs an elimination reaction of a substituent group introduced in a side chain of a semiconductor source material. For example, in a compound substituted by an alkyl group having 2 or more carbon atoms with β-hydrogen a β-elimination reaction occurs, and in a compound having a phenyl group radical elimination occurs. With such a thermal decomposition reaction a polycrystalline thin film of silicon or germanium can be formed. If the thermal decomposition temperature is lowered by using ultraviolet irradiation to decompose the compound, an amorphous thin film can be formed. Note that these thin films slightly contain hydrogen in addition to the group IV element.

A mixed semiconductor thin film of silicon and germanium can be formed by coating a mixture solution of a silane compound and a germanium compound or a solution of a copolymer including repeating units of silane and germanium, and then thermally decomposing them. The former method is preferable for controlling the composition of silicon and germanium.

In the present invention, a semiconductor thin film having a desired conductivity type can also be formed by using a dopant source material of p-type or n-type conductivity. There can be used the following two methods for this purpose. In one method (1), a semiconductor containing impurities of desired conductivity type can be deposited by the steps of adding p- or n-type dopant source material into a solution of a semiconductor source material selected from the group consisting of compounds represented by the general formulae (I) to (VI), coating the solution on a substrate, and thermally decomposing the solution. In the other method (2), a semiconductor containing impurities of desired conductivity type can be deposited by the steps of coating a solution of a semiconductor source material selected from the group consisting of compounds represented by the general formulae (I) to (VI) on a substrate, and thermally decomposing the solution in an atmosphere containing p- or n-type dopant source material. An apparatus and reaction conditions for performing these methods may be the same as those described above.

These methods generally use boron (B) as p-type impurity and use phosphorus (P), arsenic (As) or antimony (Sb) as n-type impurity. The method of (1) uses an alkylated compound of an impurity element and a compound having a bond between an impurity element and Si in a molecule as a dopant source material. The method of (2) uses an alkylated compound of an impurity element, a compound having a bond between an impurity element and Si in a molecule, and a hydride of an impurity element as a dopant source material. Although the ratio of the dopant source material to the semiconductor source material depends upon impurity concentration required for a semiconductor thin film to be formed, it is preferable that the number of impurity atoms to the total number of silicon atoms is set to be 0.1 to 10%.

Examples of the alkylated compounds of p-type impurity are $BPh_3$, $BMePh_2$ and $B(t\text{—}Bu)_3$, for example. Examples of the compounds having a bond between p-type impurity element and Si are $B(SiMe_3)_3$, $PhB(SiMe_3)_2$, $Cl_2B(SiMe_3)$, etc. An example of the hydride of p-type impurity is diborane, for example.

Examples of the alkylated compounds of n-type impurity are $PPh_3$, $PMePh_2$, $P(t\text{—}Bu)_3$, $AsPh_3$, $AsMePh_2$, $As(t\text{—}Bu)_3$, $SbPh_3$, $SbMePh_2$ and $Sb(t\text{—}Bu)_3$, for example. Examples of the compounds having a bond between n-type impurity and Si are $P(SiMe_3)_3$, $PhP(SiMe_3)_2$, $Cl_2P(SiMe_3)$, $As(SiMe_3)_3$, $PhAs(SiMe_3)_2$, $Cl_2As(SiMe_3)Sb(SiMe_3)_3$, $PhSb(SiMe_3)_2$, $Cl_2Sb(SiMe_3)$, etc. Examples of the hydrides of n-type impurity are phosphine and arsine, for example.

When there are used compounds having a B—Si bond or compounds having a P(As or Sb)—Si bond among the above dopant source materials, the carbon amount incorporated in a semiconductor thin film can be particularly restricted because these compounds have reduced bonds between impurity and C, and therefore the electric characteristics of the semiconductor thin film can be improved.

Note that when a compound having a B—Si bond or a compound having a P(As or Sb)—Si bond as a dopant source material is used, octasilacubane represented by the following general formula as a silicon source material may be used.

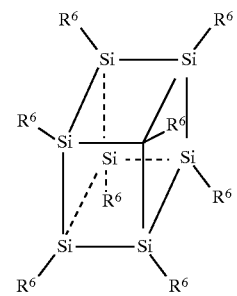

As a substituent group $R_6$, those represented by the following formulae, for example, are introduced.

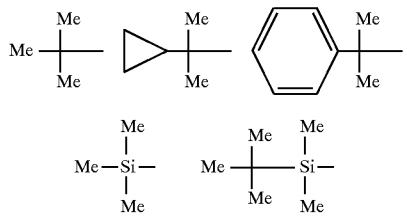

Among these substituents, octasilacubane having a trimethylsilyl group ($Me_3Si$—) is particularly preferable because it has a good solubility into an organic solvent.

In the following, there will be described a method of forming a compound semiconductor thin film according to the present invention.

Compound semiconductors related to the present invention are II-VI group compound semiconductors, III-V group compound semiconductors and chalcopyrolite type compound semiconductors. More specifically, examples of the II-VI group compound semiconductors are ZnS, ZnTe, CdS, CdSe and CdTe, examples of the III-V group compound semiconductors are GaN, GaP, GaAs, InN, InP and InAs, and examples of the chalcopyrolite-type compound semiconductors are $CuInSe_2$, $CuAlTe_2$, $CdGaP_2$ and $ZnGeAs_2$.

In the present invention, as the organometallic compounds, there are used compounds containing a group II or III metal element such as Zn, Cd, Cu, Ga, In and Al, which are the constituents of the above compound semiconductors. These organometallic compounds do not include an oxygen atom, and have a relatively low vapor pressure (e.g., 1 mmHg or lower) at thermal decomposition temperature (e.g., 200° to 400° C.) where metal element is deposited, and are dissolved in an organic solvent with solubility of 1 g/L or more.

Since the organometallic compounds used in the present invention are soluble in an organic solvent, they can be formed into a film on a large area substrate by using any coating process such as dipping, spin coating and spray coating. Herein, instruments used in the coating process can be arbitrarily selected in accordance with the size of a substrate and are capable of preventing the atmosphere from being mixed thereinto, and eliminate the use of a highly sealed and large-scaled vacuum apparatus as in the case of the vapor phase deposition. It is desirable to perform the coating process in an inactive gas atmosphere if the organometallic oxide is likely to be oxidized.

The present invention uses a reducing atmosphere containing a hydride of a nonmetal element or its derivative where the coating film of the organometallic compound coated on a substrate is heat-treated. The reducing atmosphere primarily contains hydrogen. Examples of V or VI group nonmetal elements constituting the above compound semiconductors are Se, Te, S, P, As. Examples of hydrides are selenium hydride($H_2Se$), tellurium hydride($H_2Te$), hydrogen sulfide ($H_2S$), phosphine ($PH_3$) and arsine($AsH_3$). Examples of derivatives of hydride are dimethyl selenium (($CH_3$)$_2$Se), dimethyl tellurium (($CH_3$)$_2$Te), methylphosphine ($CH_3PH_2$), ethylphosphine ($C_2H_5PH_2$), dimethylphosphine (($CH_3$)$_2$PH), diethylphosphine (($C_2H_5$)$_2$PH), trimethylphosphine (($CH_3$)$_3$P), triethylphosphine (($C_2H_5$)$_3$P), methylarsine ($CH_3AsH_2$), dimethylarsine (($CH_3$)$_2$AsH), trimethylarsine (($CH_3$)$_3$As).

In the present invention, a solution of the organometallic compound coated on a substrate is heat-treated in the reducing atmosphere containing the hydride of the nonmetal element or its derivative whereby an organic solvent is first evaporated, and then metal is deposited from the organometallic compound and is brought into a reaction with the hydride of the nonmetal element or its derivative to form a compound semiconductor thin film consisting of metal-nonmetal. In this case, the thermal decomposition temperature depends upon the organometallic compound and the hydride of the nonmetal element or its derivative, and falls within the range of 300° to 700° C. in many cases. With such a heat-treatment, there can be formed a polycrystalline compound semiconductor thin film, and further an amorphous compound semiconductor thin film depending upon the conditions.

In the present invention, as described above, a solution of an organometallic compound is first coated, and thereafter a metal element is deposited from the organometallic compound by thermal decomposition and is brought into a reaction with a hydride of a nonmetal element or its derivative. In this case, preventive measure of oxidation of the compound semiconductor thin film may be considered only in the latter process, and hence limitation to the apparatus is reduced. Accordingly, even with a large area substrate a uniform compound semiconductor thin film can be formed.

Figure 1B:
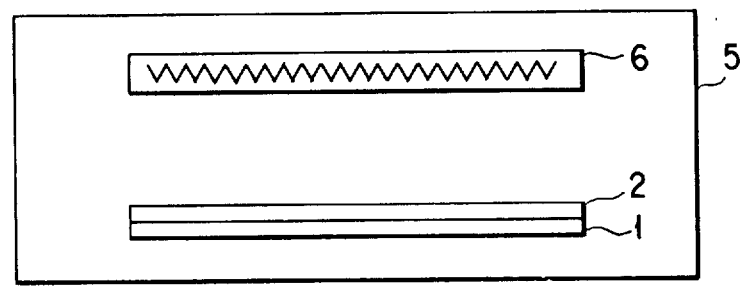
Figure 2:
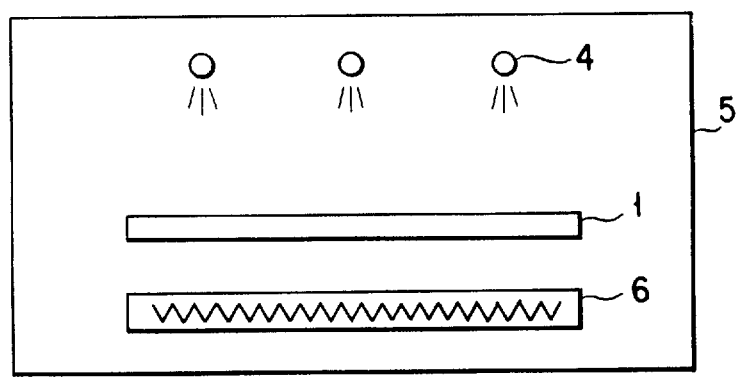
FIG. 2 is a schematic view illustrating other apparatus for performing the method of the present invention.
Figure 3:
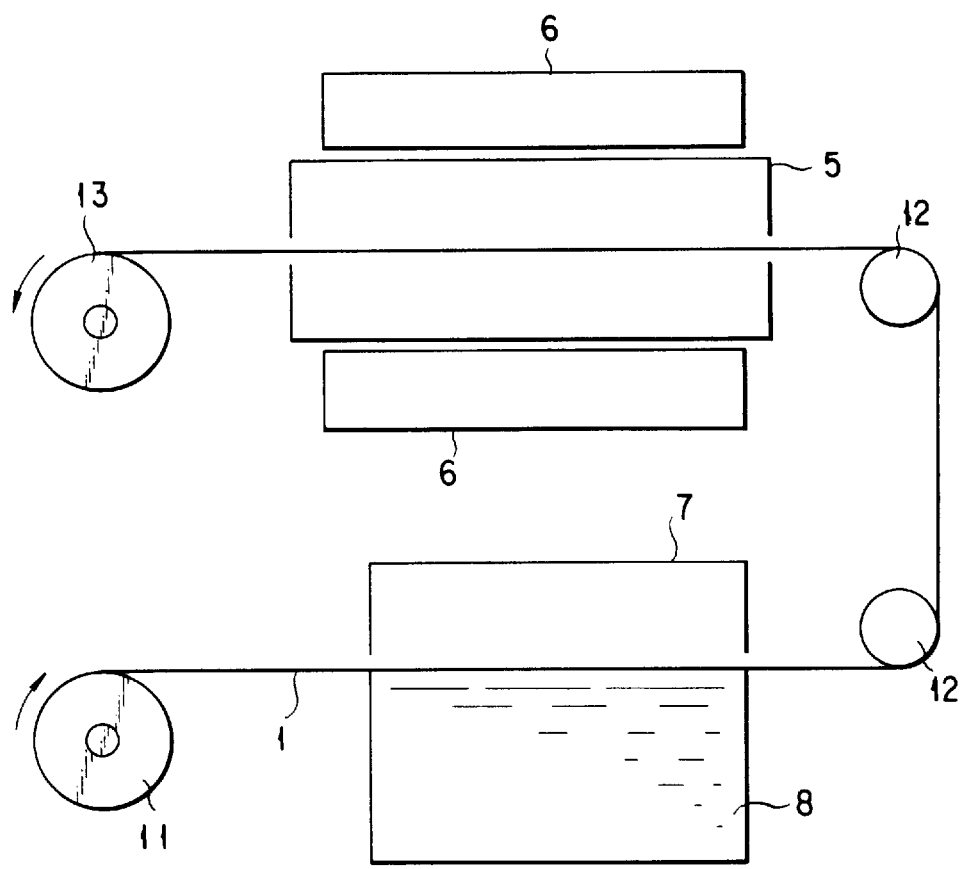
FIG. 3 is a schematic view illustrating another apparatus for performing the method of the present invention.

Apparatuses for performing the method of the present invention are schematically illustrated in FIGS. 1 to 3.

As illustrated in FIG. 1A, a substrate 1 is put in an coating apparatus 3 provided with nozzles 4, and nitrogen is introduced in of the apparatus 3 in order to prevent the air from being mixed into the apparatus 3. Thereafter, a solution of a semiconductor source material is sprayed from the nozzles 4 onto the substrate 1. In this case, the amount of the solution coated on the substrate 1 can be controlled by properly setting a nozzle shape and spray time. Then, as illustrated in FIG. 1B, the substrate 1 on which the solution of the semiconductor source material is coated is placed in a hydrogen furnace 5 and is heated with a heater 6 in a reducing gas atmosphere principally involving hydrogen thereby thermally decomposing the semiconductor source material to deposit a semiconductor thin film 2 on the substrate 1. The heater 6 includes an infrared heater and a resistance heater, etc.

An apparatus as illustrated in FIG. 2 may be used. In this case, a substrate 1 is put in a hydrogen furnace 5 and a solution of a semiconductor source material is directly sprayed from nozzles 4 onto the substrate 1, and the substrate 1 is heated with a heater 6 thereby thermally decomposing the semiconductor source material to deposit a semiconductor thin film.

FIG. 3 illustrates an apparatus for continuously fabricating a semiconductor thin film using a flexible substrate. The flexible substrate 1 is supplied from a supply roll 11 and is dipped in solution 8 of a semiconductor source material in a bath 7. The substrate 1 is fed to a hydrogen furnace 5 with feed rolls 12, 12. The semiconductor source material is heated with a heater 6 in the hydrogen furnace 5 and thermally decomposed to deposit a semiconductor thin film on the substrate 1. Thereafter, the substrate 1 is wound on a wind roll 13. The semiconductor thin film can be continuously formed on the flexible substrate in such a manner.

In the present invention, a large area solar cell can be fabricated using the method of forming a semiconductor thin film as described above. A solar cell has a structure in which two or more semiconductor thin films having any conductivity type of i, p and n are provided between a pair of electrodes to form a semiconductor junction. Therefore, a semiconductor junction such as p-n, pin, i-p, and i-n can be realized by forming two or more semiconductor thin films consisting of silicon, germanium or a compound semiconductor by repeating the above method.

When a solar cell is fabricated according to the present invention, a multi-layered semiconductor thin film can be laminated using an apparatus in which a plurality of sets of a source material bath and a hydrogen furnace as illustrated in FIG. 3 are connected together and using a flexible substrate in a continuous process. Therefore, the present invention is advantageous to fabrication of a large area solar cell.

In the present invention, as described above, a solution of a semiconductor source material is first coated and thereafter a semiconductor is deposited by thermal decomposition so that a uniform semiconductor thin film can be formed even with a large area substrate, and further a large area solar cell can be fabricated by using the above method.

It is obvious that although the method of the present invention is developed to principally fabricate a solar cell, it is effective for fabrication of a large area amorphous silicon TFT. Furthermore, the method of the present invention is applicable also to a curved substrate and hence application of other fields can be anticipated.

EXAMPLES

In the following, examples of the present invention will be described.

Example 1

Dichlorosilane is dissolved in tetrahydrofuran to which metal lithium is added to polymerize dichlorosilane under desired polymerization conditions, thereby synthesizing a linear polysilane having a one-dimensional chain structure represented by $-(SiH_2)_n-$, which is precipitated as a solid product. Resultant linear polysilane is a mixture of polysilanes having n of 5 to 15. The polysilane is solid at room temperature and is soluble in an organic solvent such as xylene.

A solution of the polysilane in xylene is coated on a silicon substrate, a quartz substrate, a glass substrate or a stainless steel foil. Each substrate is put in a hydrogen furnace followed by evaporating xylene, and then the polysilane is thermally decomposed at 650° C. to deposit silicon. Under the above conditions, a polycrystalline silicon thin film is formed.

When a pressure is set to 1 atm with flowing hydrogen at a flow rate of 2 m/min and the polysilane is irradiated with UV light at power of 10 J using a KrF excimer laser to lower thermal decomposition temperature to 350° C., an amorphous silicon thin film can be formed.

When the same coating process as described above is performed and then a process of depositing silicon by thermally decomposing the polysilane is performed in a hydrogen atmosphere containing diborane, a p-type silicon thin film can be formed. When the same coating process as described above is performed and then a process of depositing silicon by thermally decomposing the polysilane is performed in a hydrogen atmosphere containing arsine, an n-type silicon thin film can be formed. In the latter process, phosphine may be used instead of arsine.

Figure 4:
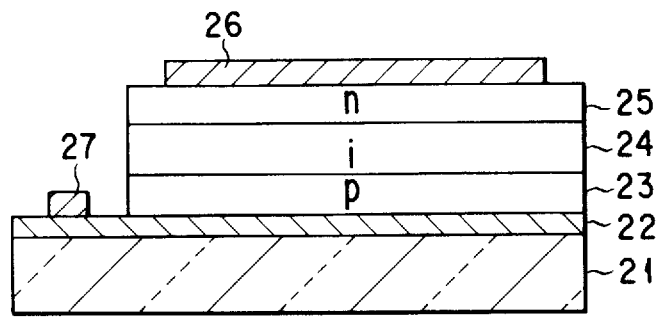
FIG. 4 is a sectional view illustrating a solar cell fabricated in the present invention.

A solar cell illustrated in FIG. 4 can be fabricated using the above method of forming a silicon thin film. In FIG. 4, on a glass substrate 21, there is formed a transparent electrode 22 consisting of tin oxide ($SnO_2$) or indium tin oxide (ITO). On the transparent electrode 22, there are laminated in order a 0.1 μm thick p-type amorphous silicon layer 23, a 0.5 μm thick undoped (i-type) amorphous silicon layer 24 and a 0.1 μm n-type amorphous silicon layer 25 such that a part of the transparent electrode 22 is exposed, by repeating steps of coating polysilane solution and thermally decomposing the polysilane. Further, there are formed an aluminum electrode 26 on the n-type amorphous silicon layer 25 and an aluminum electrode 27 on the exposed transparent electrode 22, respectively.

A conversion efficiency of the solar cell estimated from a measurement of photovoltaic effect is 7.8%, which is as good as that of a conventional amorphous silicon solar cell.

Example 2

One liter of toluene is added into a flask filled with Ar, in which 2.2 mol finely cut metal Na is added. A mixed solution of 1 mol diethyldichlorosilane and 0.05 mol triethylchlorosilane in 100 mL toluene is dropped into the flask over one hour. The dropping rate is controlled such that reaction temperature does not exceed 100° C. After completion of the dropping, the reaction is further continued at 110° C. for 2 hours. After non-reacted metal is treated with ethanol, linear polysilane is precipitated in ethanol. The polysilane is represented by $-(SiEt_2)_n-$ and has a molecular weight of about 3000.

A solution of the polysilane in xylene is coated on a silicon substrate, a quartz substrate, a glass substrate or a stainless steel foil. Each substrate is put in a hydrogen furnace followed by evaporating xylene, and then the polysilane is thermally decomposed at 450° C. to deposit silicon. Under the above conditions, a polycrystalline silicon thin film is formed on the substrate.

When a pressure is set to 1 atm with flowing hydrogen at a rate of 2 m/min and the polysilane is irradiated with UV light at power of 10 J using a KrF excimer laser to lower the thermal decomposition temperature to 350° C., an amorphous silicon thin film can be formed.

A p- or n-type silicon thin film can be formed using the same process as that in Example 1. A laminated structure having pn junction consisting of n-type silicon film and p-type silicon film formed by repeating these processes exhibits photovoltaic effect.

In the case where a polysilane having a substituent R selected from $-CH(CH_3)_2$, $-C(CH_3)_3$, $-C(CH_3)Ph_2$ and $-C(CH_3)(cyclopropyl)_2$, a good result is achieved as well.

Example 3

A linear polysilane represented by $-(SiEtPh)_n-$, having a molecular weight of about 5000, is used as a silicon source compound in this Example 3. The polysilane is solid at room temperature and is soluble in an organic solvent such as xylene.

A solution of the polysilane in xylene is coated on a silicon substrate, a quartz substrate, a glass substrate or a stainless steel foil. Each substrate is put in a hydrogen furnace followed by evaporating xylene, and then the polysilane is thermally decomposed at 450° C. to deposit silicon. Under the above conditions, a polycrystalline silicon thin film is formed on the substrate.

When a pressure is set to 1 atm with flowing hydrogen at a rate of 2 m/min and the polysilane is irradiated with UV light at power of 10 J using a KrF excimer laser to lower the thermal decomposition temperature to 370° C., an amorphous silicon thin film can be formed.

A p- or n-type silicon thin film can be formed using the same method to that in Example 1.

Figure 5:
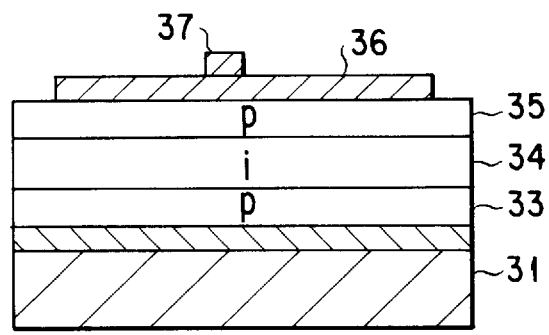
FIG. 5 is a sectional view illustrating a solar cell fabricated in the present invention.

Further, a solar cell illustrated in FIG. 5 can be fabricated by forming a multi-layered silicon thin film by repeating processes of forming silicon thin films as described above. In FIG. 5, a molybdenum electrode 32 is formed on a stainless steel substrate 31. On the molybdenum electrode 32, there are formed in order a 0.1 μm p-type amorphous silicon layer 33, a 0.4 μm thick i-type amorphous silicon layer 34 and a 0.1 μm thick p-type amorphous silicon layer 35. On the p-type amorphous silicon layer 35 there are formed in order an ITO electrode 36 and an aluminum electrode 37.

A conversion efficiency of the solar cell estimated from a measurement of photovoltaic effect is 8.3%, which is as good as that of a conventional amorphous solar cell.

Example 4

Cyclic polysilane represented by $(Si(t-Bu)_2)_n$, where n is 3 or 4, is used as a silicon source compound in this Example 4. The cyclic polysilane is solid at room temperature and is soluble in an organic solvent such as toluene.

A solution of the cyclic polysilane in toluene is coated on a silicon substrate, a quartz substrate, a glass substrate or a stainless steel foil. Each substrate is put in a hydrogen furnace followed by evaporating toluene, and then the cyclic polysilane is thermally decomposed at 430° C. to deposit silicon. Under the above conditions, a polycrystalline silicon thin film can be formed on the substrate.

When a pressure is set to 1 atm with flowing hydrogen at a rate of 2 m/min and the polysilane is irradiated with UV light at power of 10 J using a KrF excimer laser to lower the thermal decomposition temperature to 350° C., an amorphous silicon thin film can be formed.

A p- or n-type silicon thin film can be formed using the same process as that in Example 1.

Figure 6:
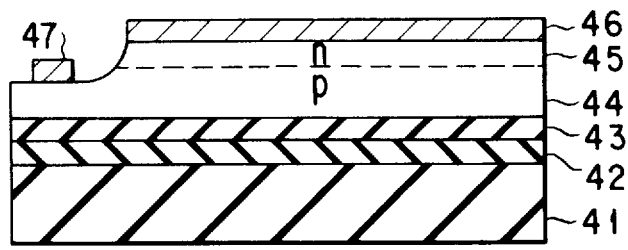
FIG. 6 is a sectional view illustrating a solar cell fabricated in the present invention.

A solar cell illustrated in FIG. 6 can be fabricated by forming a multi-layered silicon thin film by repeating processes of forming silicon thin films described above. In FIG. 6, there are laminated in order a $SiO_2$ film 42 and a $Si_3N_4$ film 43 on an alumina substrate 41. On the $Si_3N_4$ film 43, a 10 $\mu$m thick boron-doped p-type polycrystalline silicon layer 44 is formed. An n-type diffusion layer 45 is formed by doping phosphorus into the p-type polycrystalline silicon layer 44. An ITO electrode 46 is formed on the n-type diffusion layer 45. Further, an aluminum electrode 47 is formed on p-type polycrystalline silicon layer 44 exposed by mesa etching. This structure exhibits characteristics of a solar cell.

Example 5

A linear polygermane, having a molecular weight of about 3000, or a cyclic polygermane represented by —$(GeEt_2)_n$— is used as a germanium source compound in this Example 5. These compounds are solid at room temperature and are soluble in an organic solvent such as xylene.

A solution of the polygermane in xylene is coated on a silicon substrate, a quartz substrate, a glass substrate or a stainless steel foil. Each substrate is put in a hydrogen furnace followed by evaporating xylene, and then the polygermane is thermally decomposed at 550° C. to deposit germanium. Under the above conditions, a polycrystalline germanium thin film is formed on the substrate.

When a pressure is set to 1 atm with flowing hydrogen at a rate of 2 m/min and the polygermane is irradiated with UV light at power of 10 J using a KrF eximer laser to lower the thermal decomposition temperature to 200° C., an amorphous germanium thin film can be formed.

Example 6

A linear polysilane, having a molecular weight of about 1000, or a cyclic polysilane represented by —$(SiH_2)_n$— is used as a silicon source compound and a linear polygermane, having a molecular weight of about 1000, or a cyclic polygermane represented by —$(GeH_2)_n$— is used as a germanium source compound in this Example 6. These compounds are solid at room temperature and are soluble in an organic solvent such as xylene.

Solutions of the polysilane and polygermane individually dissolved in xylene are coated at a desired mixing ratio on a silicon substrate, a quartz substrate, a glass substrate or a stainless steel foil. Each substrate is put in a hydrogen furnace followed by evaporating xylene, and then the polysilane and polygermane are thermally decomposed at 650° C. to deposit silicon and germanium. Under the above conditions, a polycrystalline silicon-germanium thin film, having a molar ratio substantially corresponding to the molar ratio of the source compounds, is formed on the substrate.

When a pressure is set to 1 atm with flowing hydrogen at a rate of 2 m/min and the polysilane and polygermane are irradiated with UV light at power of 10 J using a KrF excimer laser to lower the thermal decomposition temperature to 350° C., an amorphous silicon-germanium thin film can be formed.

A laminated structure having np junction formed by doping a donor and an acceptor to a Si thin film and a SiGe mixture thin film upon laminating those films by combining the processes described above, exhibits photovoltaic effect.

Example 7

A linear polysilane, having a molecular weight of about 12000, represented by —$(SiHPh)_n$— as a silicon source compound and $P(SiMe_3)_3$ as an n-type impurity source material are used in this Example 7. A toluene solution of a mixture of these compounds is spin-coated on a quartz substrate, and is vacuum dried at 70° C. for 1 hour. The substrate is heated for 1 hour at 300° C. and for 1 hour at 700° C. in a mixed gas of argon and hydrogen to thermally decompose the source materials. In this case, phosphorus-doped silicon thin film is formed.

Example 8

A halogen compound $Si_5Cl_{12}$, which is a compound called perchlorosilane, is used as silicon source material in this Example 8. The compound has a melting point of 345° C. and is soluble in an organic solvent such as petroleum ether.

A solution of $Si_5Cl_{12}$ in petroleum ether is coated on a silicon substrate, a quartz substrate, a glass substrate or a stainless steel foil. Each substrate is put in a hydrogen furnace followed by evaporating petroleum ether, and then $Si_5Cl_{12}$ is thermally decomposed at 450° C. to deposit silicon. Under the above conditions, an amorphous silicon thin film is formed on a substrate. A polycrystalline silicon thin film can be formed by raising heating temperature.

When the same coating process as described above is performed and then a process of depositing silicon by thermally decomposing the halide is performed in a hydrogen atmosphere containing diborane, p-type silicon thin film can be formed. When the same coating process as described above is performed and a process of depositing silicon is performed in a hydrogen atmosphere containing arsine, an n-type silicon thin film can be formed. In the latter process, phosphine may be used instead of arsine.

A solar cell illustrated in FIG. 4 can be fabricated using the above method of forming a silicon film. A conversion efficiency of the solar cell estimated from a measurement of photovoltaic effect is 8.5%, which is as good as that of a conventional amorphous silicon solar cell.

Example 9

A halide $Si_6Cl_{14}$ is used as a silicon source material in this Example 9. The compound has a melting point of 320° C. and is soluble in an organic solvent such as petroleum ether.

A solution of $Si_6Cl_{14}$ in petroleum ether is coated on a silicon substrate, a quartz substrate, a glass substrate or a stainless steel foil. Each substrate is put in a hydrogen furnace followed by evaporating petroleum ether and then $Si_6Cl_{14}$ is thermally decomposed at 440° C. to deposit silicon. Under the above conditions, an amorphous silicon thin film is formed on the substrate. A polycrystalline silicon thin film can be formed by raising heating temperature.

A p- or n-type silicon thin film can be formed using the same process as that in Example 8. A laminated structure having np junction consisting of an n-type silicon thin film and p-type silicon thin film formed by repeating these processes exhibits photovoltaic effect.

Example 10

The same halide $Si_5Cl_{12}$ as in Example 8 is used as a silicon source material in this Example 10. By a mechanical treatment at a temperature around the melting point, $Si_5Cl_{12}$ is coated on a silicon substrate, a quartz substrate, a glass substrate or a stainless steel foil. Each substrate is put in a hydrogen furnace, and then $Si_5Cl_{12}$ is thermally decomposed at 450° C. to deposit silicon. Under the above conditions, an amorphous silicon thin film is formed on the substrate. A polycrystalline silicon thin film can be formed by raising heating temperature.

A p- or n-type silicon thin film can be formed by using the same process as that in Example 8. A multi-layered silicon thin film is formed to fabricate a solar cell illustrated in FIG. 5 by repeating the processes of forming silicon thin films described above. A conversion efficiency of the solar cell estimated from a measurement of photovoltaic effect is 14%, which is as good as that of a conventional amorphous silicon solar cell.

Example 11

The same halide $Si_6Cl_{14}$ as in Example 9 is used as a silicon source material in this Example 11. By a mechanical treatment at a temperature near the melting point, $Si_6Cl_{14}$ is coated on a silicon substrate, a quartz substrate, a glass substrate or a stainless steel foil. Each substrate is put in a hydrogen furnace, and then $Si_6Cl_{14}$ is thermally decomposed at 440° C. to deposit silicon. Under the above conditions, an amorphous silicon thin film is formed on the substrate. A polycrystalline silicon thin film can be formed by raising heating temperature.

A p- or n-type silicon thin film can be formed using the same process as in Example 8. A solar cell illustrated in FIG. 6 formed by repeating the processes of forming silicon thin films described above, exhibits photovoltaic effect.

Example 12

A halide $Ge_5Cl_{12}$ is used as a germanium source material in this Example 12. The compound is soluble in an organic solvent such as petroleum ether. A solution of $Ge_3Cl_{12}$ in petroleum ether is coated on a silicon substrate, a quartz substrate, a glass substrate or a stainless steel foil. Each substrate is put in a hydrogen furnace followed by evaporating petroleum ether, and then $Ge_5Cl_{12}$ is thermally decomposed at 400° C. to deposit germanium. Under the above conditions, a polycrystalline germanium thin film is formed on the substrate. When thermal decomposition temperature is lowered by irradiating with UV light, an amorphous germanium thin film can be formed.

Example 13

A halide $Si_5Br_{12}$ is used as a silicon source material in this Example 13. By a mechanical treatment at a temperature near the melting point, $Si_5Br_{12}$ is coated on a silicon substrate, a quartz substrate, a glass substrate or a stainless steel foil. Each substrate is put in a hydrogen furnace, and then $Si_5Br_{12}$ is thermally decomposed at 440° C. to deposit silicon. Under the above conditions, an amorphous silicon thin film is formed on the substrate. A polycrystalline silicon thin film can be formed by raising heating temperature.

A p- or n-type silicon thin film can be formed using the same process as that in Example 8. A solar cell illustrated in FIG. 6 formed by repeating the processes of forming silicon thin films described above exhibits photovoltaic effect.

Example 14

A solution of a silane compound as a silicon source material represented by the following formula dissolved in xylene is coated on a silicon substrate, a quartz substrate, a glass substrate or a stainless steel foil. Each substrate is put in a hydrogen furnace followed by evaporating xylene, and then the silane compound is thermally decomposed at 650° C. to deposit silicon. Under the above conditions, a polycrystalline silicon thin film is formed on the substrate.

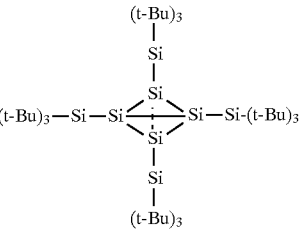

When a pressure is set to 1 atm with flowing hydrogen at a rate of 2 m/min and the silane compound is irradiated with UV light at power of 10 J using a KrF excimer laser to lower the thermal decomposition temperature to 350° C., an amorphous silicon thin film can be formed.

When the same coating process as described above is preformed and then a process of depositing silicon by thermally decomposing the silane compound is performed in a hydrogen atmosphere containing diborane, p-type silicon thin film can be formed. When the same coating process as described above is performed and then a process of depositing silicon by thermally decomposing is performed in a hydrogen atmosphere containing arsine, an n-type silicon thin film can be formed. In the latter process, phosphine may be used instead of arsine.

A solar cell illustrated in FIG. 4 can be formed by using the processes of forming silicon thin films described above. A conversion efficiency of the solar cell estimated from a measurement of photovoltaic effect is 8.5%, which is as good as that of a conventional amorphous silicon solar cell.

A conversion efficiency of a solar cell illustrated in FIG. 5 and fabricated in the same manner estimated from a measurement of photovoltaic effect is 8.3%, which is as good as that of a conventional amorphous silicon solar cell.

A solar cell illustrated in FIG. 6 fabricated in the same manner also exhibits photovoltaic effect.

Example 15

A silylene compound represented by the following formula is used as a silicon source material and $P(SiMe_3)_3$ is used as an n-type impurity source material in this Example 15. A toluene solution of a mixture of these compounds is spin-coated on a quartz substrate and then vacuum dried at 70° C. for 1 hour. The substrate is heated in a mixed gas of argon and hydrogen at 300° C. for 1 hour and then at 600° C. for 1 hour to thermally decompose the source materials.

In this case, phosphorus-doped silicon thin film is formed.

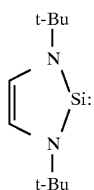

Example 16

An octasilacubane compound substituted by trimethylsilyl (TMS) groups as a silicon source material, which is represented by the following formula, and $P(SiMe_3)_3$ as an n-type impurity source material are used in this Example 16. A toluene solution of a mixture of these compounds is spin-coated on a quartz substrate, and then vacuum dried at 70° C. for 1 hour. The substrate is heated at 300° C. for 1 hour and at 600° C. for 1 hour in a mixed gas of argon and hydrogen to thermally decompose the source materials. In this case, phosphorus-doped silicon thin film is formed.

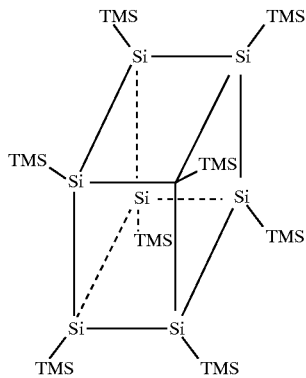

Example 17

An example of forming a polycrystalline thin film of InP, which is a III-V group compound semiconductor, will be described.

Trimethyl indium that is an organometallic compound as an indium source material is used in this Example 17. The compound forms crystal at room temperature, and is soluble in an organic solvent. A trimethyl indium solution is coated on a stainless steel foil in a nitrogen atmosphere. The foil is put is a hydrogen furnace and is heated in a hydrogen atmosphere containing phosphine by 10% thereby evaporating the solvent, and then trimethyl indium is reacted with phosphine at 700° C. to form a polycrystalline InP thin film having substantially stoichiometrical composition. The reaction temperature can be lowered to 550° C. by irradiating with ultraviolet light. In this case, deposited thin film becomes amorphous.

Example 18

An example of forming a polycrystalline thin film of ZnSe, which is a II-VI group compound semiconductor, will be described.

Bispentafluorophenyl zinc that is an organo-metallic compound as a zinc source material is used in this Example 18. The compound forms crystal at room temperature, and is soluble in an organic solvent. A bispentafluorophenyl zinc solution is coated on a glass substrate in a nitrogen gas atmosphere. The glass substrate is put in a hydrogen furnace and is heated in a hydrogen atmosphere containing selenium hydride by 10% thereby evaporating the solvent, and then bispentafluorophenyl zinc is reacted with selenium hydride at 450° C. to form a polycrystalline ZnSe thin film. Depending upon reaction conditions, formation of amorphous thin film is also observed.

Example 19

Examples of forming polycrystalline thin films of CdT and CdS, which are II-VI group compound semiconductors will be described.

Diphenyl cadmium that is an organometallic compound as a cadmium source material is used in this Example 19. The compound forms crystal at room temperature, and is soluble in an organic solvent. A diphenyl cadmium solution is coated on a glass substrate in a nitrogen atmosphere. The glass substrate is put in a hydrogen furnace and is heated in a hydrogen gas atmosphere containing tellurium hydride by 10% thereby evaporating the solvent, and then diphenyl cadmium is reacted with tellurium hydride at 470° C. form a polycrystalline CdTe thin film. Likewise, a polycrystalline CdS thin film is obtained by using hydrogen sulfide instead of tellurium hydride.

Figure 7:
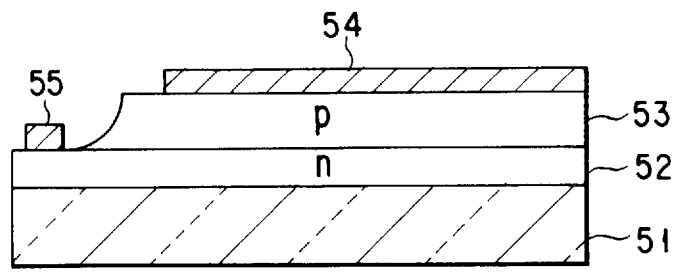
FIG. 7 is a sectional view illustrating a solar cell fabricated in the present invention.

A solar cell having pn junction of CdTe/CdS, illustrated in FIG. 7, can be fabricated using the processes of forming compound semiconductor thin films described above. In FIG. 7, an n-type CdS polycrystalline thin film 52 is formed on a glass substrate 51. A p-type CdTe polycrystalline thin film 53 is formed on a part of the n-type CdS polycrystalline thin film 52. An ohmic electrode 54 consisting of Au is formed on the p-type CdTe polycrystalline thin film 53. Further, an ohmic electrode 55 consisting of In is formed on the exposed n-type CdS polycrystalline thin film 52. The solar cell represents an excellent characteristic of a quantum yield of 13%.

Example 20

An example of forming a polycrystalline thin film of $CuInSe_2$, which is a chalcopyrolite-type compound semiconductor, will be described.

2, 4, 6-trimethylphenyl copper that is an organometallic compound as a copper source material in this Example 20. The compound forms a pentamer with five molecules, which is crystal at room temperature and is soluble in toluene. A solution of 2, 4, 6-trimethylphenyl copper is coated on a stainless steel foil in a nitrogen atmosphere. The stainless steel foil is put in a hydrogen furnace, and then 2, 4, 6-trimethylphenyl copper is thermally decomposed at 450° C. to deposit copper. In this case, a pure copper thin film is formed on the stainless steel foil.

The same indium source material, trimethyl indium, is used as in Example 17. A toluene solution of 2, 4, 6-trimethylphenyl copper and trimethyl indium is coated on an aluminum foil in a nitrogen atmosphere. The aluminum foil is put in a hydrogen furnace and heated in a hydrogen atmosphere containing 10% selenium hydride thereby evaporating the solvent, and then 2, 4, 6-trimethylphenyl copper is reacted with trimethyl indium at 650° C. to form a polycrystalline $CuInSe_2$ thin film having substantially stoichiometrical composition. The polycrystalline $CuInSe_2$ thin film exhibits p-type conductivity. Formation of an amorphous thin film is also observed depending upon reaction conditions.

A polycrystalline p-type $CuGaSe_2$ thin film can be obtained by using ($\eta_5$-2-4-cyclopentadien-1-yl) dimethyl gallium instead of trimethyl indium. A polycrystalline p-type $Cu(In_{1-x}Ga_x)Se_2$ thin film can be obtained by using together trimethyl indium and ($\eta_5$-2-4-cyclopentadien-1-yl) dimethyl gallium.

Figure 8:
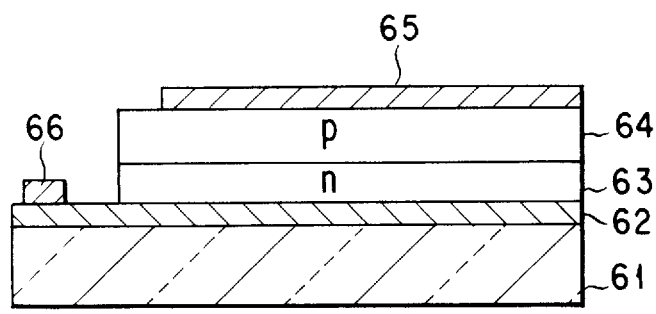
FIG. 8 is a sectional view illustrating a solar cell fabricated in the present invention.
Figure 9:
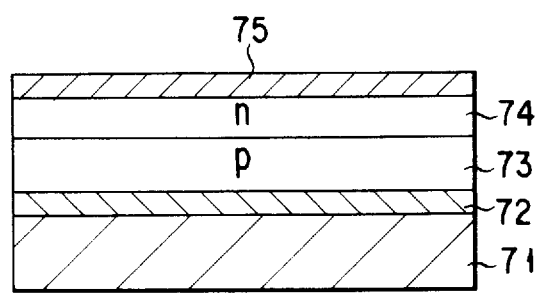
FIG. 9 is a sectional view illustrating a solar cell fabricated in of the present invention.

A solar cell having a pn junction illustrated in FIGS. 8 or 9 can be fabricated using the processes of forming compound semiconductor thin films described above.

In FIG. 8, a transparent electrode 62 consisting of indium tin oxide (ITO) is formed on a glass substrate 61. An n-type CdS polycrystalline thin film 63 and p-type $CuInSe_2$ polycrystalline thin film 64 are formed on a part of the transparent electrode 62. An ohmic electrode 65 is formed on the p-type $CuInSe_2$ polycrystalline thin film 64. Further, an ohmic electrode 66 is formed on the exposed transparent electrode 62.

In FIG. 9, a molybdenum electrode 72 is formed on a stainless steel substrate 71. A p-type $Cu(In_{1-x}Ga_x)Se_2$ polycrystalline thin film 73, an n-type CdS polycrystalline thin film 74 and a transparent electrode 75 consisting of ITO are formed on the molybdenum electrode 72.

These solar cells exhibit characteristics as good as those of conventional solar cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of forming a semiconductor thin film comprising steps of:

coating a solution of semiconductor source material on a substrate; and thermally decomposing said source material to liberate semiconductor, wherein said semiconductor source material is selected from the group consisting of compounds represented by the general formulae (I) and (II), compounds represented by the general formulae (III) and (VI), compounds represented by the general formula (V) and compounds represented by the general formula (VI),

where M is selected from the group consisting of silicon and germanium, and individual $R^1$ substituents are independently selected from the group consisting of hydrogen, an alkyl group having of 2 or more carbon atoms and β-hydrogen, a phenyl group, and a silyl group,

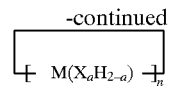

where M is selected from the group consisting of silicon and germanium, X is a halogen atom, n is an integer of 4 or more, and a is 1 or 2,

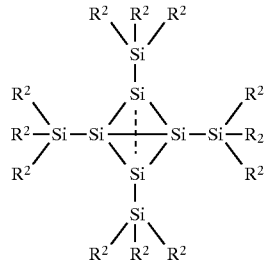

where individual $R^2$ substituents are independently selected from the group consisting of a substituted or unsubstituted alkyl group represented by the following formula, an aryl group, and an aralkyl group,

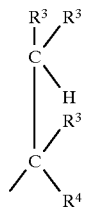

where individual $R^3$ substituents are independently selected from the group consisting of a hydrogen atom, a substituted or unsubstituted alkyl group having 1 to 15 carbon atoms, a substituted or unsubstituted aryl group having 6 to 15 carbon atoms, and a substituted or unsubstituted aralkyl group having 7 to 15 carbon atoms, and $R^4$ substituent is selected from the group consisting of a substituted or unsubstituted alkyl group having 1 to 15 carbon atoms, a substituted or unsubstituted aryl group having 6 to 15 carbon atoms, and a substituted or unsubstituted aralkyl group having 7 to 15 carbon atoms, and

where individual $R^5$ substituents are independently selected from the group consisting of a substituted or unsubstituted alkyl group having 1 to 15 carbon atoms, an aryl group, an aralkyl group, and a substituted or unsubstituted silyl group having 1 to 5 silicon atoms.

2. The method according to claim 1, wherein the thermal decomposition is performed in an inactive atmosphere or in a reducing atmosphere containing hydrogen.

3. The method according to claim 1, wherein the compound represented by the general formula (I) or (II) is thermally decomposed at 200° to 700° C.

4. The method according to claim 1, wherein the compound represented by the general formula (III) or (IV) is thermally decomposed at 300° to 500° C.

5. The method according to claim 1, wherein the compound represented by the general formula (V) or (VI) and is thermally decomposed at 300° to 700° C.

6. The method according to claim 1, comprising the steps of:
   coating a solution of a semiconductor source material selected from the group consisting of compounds represented by the general formulae (I) to (VI) mixed with a dopant source material providing p- or n-type conductivity on a substrate; and
   thermally decomposing said source materials to liberate semiconductor containing an impurity of a desired conductivity type.

7. The method according to claim 1, comprising the step of:
   coating a solution of a semiconductor source material selected from the group consisting of compounds represented by the general formulae (I) to (VI) on a substrate; and
   thermally decomposing said source material in an atmosphere containing a dopant source material providing p- or n-type conductivity to liberate semiconductor containing an impurity of a desired conductivity type.

8. The method according to claim 7, wherein said dopant source material is selected from the group consisting of an alkylated product of impurity element, a compound having a bond between impurity element and Si, and a hydride of impurity element.

9. The method according to claim 7, wherein said dopant source material is added to the semiconductor source material such that the number of impurity atoms with respect to the total number of silicon atoms is 0.1 to 10%.

10. The method according to claim 7, wherein said dopant source material contains boron as a p-type impurity.

11. The method according to claim 10, wherein said dopant source material is selected from the group consisting of $B(SiMe_3)_3$, $PhB(SiMe_3)_2$, $Cl_2B(SiMe_3)$, $BPh_3$, $BMePh_2$, $B(t-Bu)_3$ and diborane.

12. The method according to claim 7, wherein said dopant source material contains an n-type impurity selected from the group consisting of phosphorus, arsenic and antimony.

13. The method according to claim 12, wherein said dopant source material is selected from the group consisting of $P(SiMe_3)_3$, $PhP(SiMe_3)_2$, $Cl_2P(SiMe_3)$, $As(SiMe_3)_3$, $PhAs(SiMe_3)_2$, $Cl_2As(SiMe_3)$, $Sb(SiMe_3)_3$, $PhSb(SiMe_3)_2$, $Cl_2Sb(SiMe_3)$, $PPh_3$, $PMePh_2$, $P(t-Bu)_3$, $AsPh_3$, $AsMePh_2$, $As(t-Bu)_3$, $SbPh_3$, $SbMePh_2$, $Sb(t-Bu)_3$, phosphine and arsine.

14. A method of forming a compound semiconductor thin film comprising the steps of:
   coating a solution of an organometallic compound dissolved in an organic solvent on a substrate; and
   thermally decomposing said organometallic compound in a reducing atmosphere containing a hydride of a nonmetal element or derivative thereof to liberate metal from said organometallic compound and react the metal with said hydride of the nonmetal element or derivative thereof to form a compound semiconductor thin film.

15. The method according to claim 14, wherein said organometallic compound contains a metal element selected from the group consisting of Zn, Cd, Cu, Ga, In and Al.

16. The method according to claim 14, wherein said hydride of the nonmetal element is selected from the group consisting of $H_2Se$, $H_2Te$, $H_2S$, $PH_3$ and $AsH_3$.

17. The method according to claim 14, wherein the thermal decomposition is performed in a reducing atmosphere containing hydrogen.

18. A method of fabricating a solar cell having a structure in which two or more semiconductor thin films having any of i-, p- and n- conductivity type are provided between a pair of electrodes so as to form a semiconductor junction, comprising steps of repeating two or more processes of forming semiconductor thin films having different conductivity type, wherein
   the process of forming an i-type semiconductor thin film comprising steps of:
      coating a solution of a semiconductor source material selected from the group consisting of compounds represented by the general formulae (I) to (VI); and
      thermal decomposing said source material to liberate semiconductor, and wherein
   the process of forming a p- or n-type semiconductor thin film comprising steps of:
      coating a solution of a semiconductor source material selected from the group consisting of compounds represented by the general formulae (I) to (VI) mixed with a dopant source material providing p- or n-type conductivity on a substrate; and thermally decomposing said source materials to liberate semiconductor containing an impurity of a desired conductivity type, or
      coating a solution of a semiconductor source material selected from the group consisting of compounds represented by the general formulae (I) to (VI) on a substrate; and thermally decomposing said source material in an atmosphere containing a dopant source material providing p- or n-type conductivity to liberate semiconductor containing an impurity of a desired conductivity type.

19. The method according to claim 18, wherein a flexible substrate is used, and two or more semiconductor thin films are continuously formed on said flexible substrate.

20. A method of fabricating a solar cell having a structure in which two or more compound semiconductor thin films having any of i-, p- and n- conductivity type are provided between a pair of electrodes so as to form a semiconductor junction, comprising steps of repeating two or more processes of forming compound semiconductor thin films while altering the species of organometallic compound or hydride of nonmetal element or derivative thereof, wherein
   the process of forming the compound semiconductor thin film comprising steps of:
      coating a solution of an organometallic compound dissolved in an organic solvent on a substrate; and
      thermally decomposing said organometallic compound in a reducing atmosphere containing a hydride of a nonmetal element or derivative thereof to liberate metal from said organometallic compound and react the metal with said hydride of the nonmetal element or derivative thereof to form a compound semiconductor thin film.

21. The method according to claim 20, wherein a flexible substrate is used, and two or more compound semiconductor thin films are continuously formed on said flexible substrate.

* * * * *